(12) United States Patent
Wang

(10) Patent No.: US 9,087,670 B2
(45) Date of Patent: *Jul. 21, 2015

(54) ELECTRIC POTENTIAL CONTROL OF HIGH VOLTAGE INSULATION

(71) Applicant: Moxtek, Inc., Orem, UT (US)

(72) Inventor: Dongbing Wang, Lathrop, CA (US)

(73) Assignee: Motek, Inc., Orem, UT (US)

( * ) Notice: Subject to any disclaimer, the term of this patent is extended or adjusted under 35 U.S.C. 154(b) by 488 days.

This patent is subject to a terminal disclaimer.

(21) Appl. No.: 13/625,705

(22) Filed: Sep. 24, 2012

(65) Prior Publication Data

US 2013/0308757 A1 Nov. 21, 2013

Related U.S. Application Data

(60) Provisional application No. 61/549,909, filed on Oct. 21, 2011.

(51) Int. Cl.
*H05G 1/10* (2006.01)
*H01J 35/02* (2006.01)
*H05K 1/02* (2006.01)

(52) U.S. Cl.
CPC ............... *H01J 35/025* (2013.01); *H05G 1/10* (2013.01); *H05K 1/0256* (2013.01)

(58) Field of Classification Search
CPC ......... H05K 1/0256; H05G 1/08; H05G 1/10; H01J 35/025
See application file for complete search history.

(56) References Cited

U.S. PATENT DOCUMENTS 6,418,191 B1 * 7/2002 Fehre et al. .................. 378/105
8,903,047 B1 * 12/2014 Wang et al. .................. 378/101

* cited by examiner

*Primary Examiner* — Robert Kim
*Assistant Examiner* — Eliza Osenbaugh-Stewar
(74) *Attorney, Agent, or Firm* — Thorpe North & Western, LLC

(57) ABSTRACT

A high voltage device includes a circuit board 12 surrounded by an enclosure 11, potting 13 to provide electrical insulation between the circuit board 12 and the enclosure 11, and a layer of material 14, having a different resistivity than a resistivity of the potting 13, dividing the potting into separate and discrete sections. The layer of material 14 can be multiple layers. Each layer 14 can have a voltage applied, and a voltage of any layer 14 closer to the circuit board 12 can have a higher absolute value than any layer 14 farther from the circuit board 12.

20 Claims, 2 Drawing Sheets

ELECTRIC POTENTIAL CONTROL OF HIGH VOLTAGE INSULATION

CLAIM OF PRIORITY

Priority is claimed to U.S. Provisional Patent Application Ser. No. 61/549,909, filed on Oct. 21, 2011; which is hereby incorporated herein by reference in its entirety.

BACKGROUND

Many devices, such as high voltage power supplies for x-ray sources, include a power generation circuit that is maintained at a very large electrical potential relative to a grounded metal case and other low electrical potential circuits.

Insulative material, sometimes called "potting", can be used for insulating circuits at different electric potentials. A problem of very high voltage situations (e.g. ≥1 kilovolt) is breakdown or arcing of the potting. This breakdown might not occur immediately, but may occur many hours after the device is in use, resulting in failure of the device.

One aspect of potting insulative material is that its dielectric strength is typically inversely proportional to its thickness, so a thinner material has a higher dielectric strength per unit distance than a thicker material. This can pose a challenge for applications in which the potting must withstand a very large voltage differential. Two problems resulting from a thicker layer of potting material for larger voltage differentials are (1) the effectiveness of the potting is diminished, because, as mentioned previously, the dielectric strength decreases with increased thickness, and (2) the size and weight of the device is increased. Increased size and weight of the device can be especially detrimental for portable devices, such as portable x-ray sources.

SUMMARY

It has been recognized that it would be advantageous to improve insulation of high voltage devices, in order to avoid breakdown or arcing of the potting, and/or reduce potting thickness.

In one embodiment, the present invention is directed to a power source for an x-ray tube that satisfies the need for improved insulation between a circuit board and an enclosure. The power source comprises a circuit board substantially surrounded by an enclosure, the circuit board can include a high voltage component configured to have a higher voltage differential between this component and the enclosure than other components on the circuit board. A circuit on the circuit board can be configured to create a voltage differential between the high voltage component and the enclosure of at least 9 kilovolts. An electrically insulative potting material is disposed between the circuit board and the enclosure. A layer of electrically conductive material is disposed within the potting material and disposed at least partially between the circuit board and the enclosure. The layer of electrically conductive material divides at least a portion of the potting into separate and discrete sections. The separate and discrete sections of the potting have a higher dielectric strength than if the sections of potting were not divided by the layer of electrically conductive material. The separate and discrete sections of potting provide electrical insulation between the high voltage component and the enclosure. The layer of electrically conductive material is configured to have a voltage applied that is between a voltage of the high voltage component and a voltage of the enclosure.

In one embodiment, the present invention is directed to a power source for an x-ray tube that satisfies the need for improved insulation between a circuit board and an enclosure. The power source comprises a circuit board substantially surrounded by an enclosure. A circuit on the circuit board can be configured to create a voltage differential between at least one component on the circuit board and the enclosure of at least 9 kilovolts. An electrically insulative potting material is disposed between the circuit board and the enclosure. A layer of material is disposed within the potting material and disposed at least partially between the circuit board and the enclosure. The layer of material has a different resistivity than a resistivity of the potting. The layer of material divides at least a portion of the potting into separate and discrete sections. The separate and discrete sections of potting provide electrical insulation between the circuit board and the enclosure.

In one embodiment, the present invention is directed to a device, with electric potential control of high voltage insulation, that satisfies the need for improved insulation between a circuit board and an enclosure. The device comprises a circuit board substantially surrounded by an enclosure. A high voltage component on the circuit board can be configured to have a higher voltage differential between this component and the enclosure than other components on the circuit board. A circuit on the circuit board can be configured to create a voltage differential between the high voltage component and the enclosure of at least 1 kilovolt. An electrically insulative potting material is disposed between the circuit board and the enclosure. A layer of electrically conductive material is disposed within the potting material and disposed at least partially between the circuit board and the enclosure. The layer of electrically conductive material divides at least a portion of the potting into separate and discrete sections. The separate and discrete sections of potting have a higher dielectric strength than if the sections of potting were not divided by the layer of electrically conductive material. The separate and discrete sections of potting provide electrical insulation between the high voltage component and the enclosure. The layer of electrically conductive material is configured to have a voltage applied that is between a voltage of the high voltage component and a voltage of the enclosure.

DEFINITIONS

As used herein, the terms "high voltage" or "higher voltage", used herein, mean a larger absolute value of the voltage. For example, −50,000 volts is a "high voltage" and is a "higher voltage" than −20,000 volts or 0 volts.

As used herein, the terms "low voltage" or "lower voltage", used herein, mean a lower absolute value of the voltage. For example, −500 volts is a "low voltage" and is a "lower voltage" than −20,000 volts.

As used herein, the term "potting" means an electrically insulative material, initially in a less viscous state, which can be poured onto or over electronic components, coating the components and filling voids between or around the components. The potting can then harden into a solid, electrically insulative material. Examples of potting include epoxy, urethane, silicon, silicone, acrylic, and polyester.

DETAILED DESCRIPTION

Figure 1:
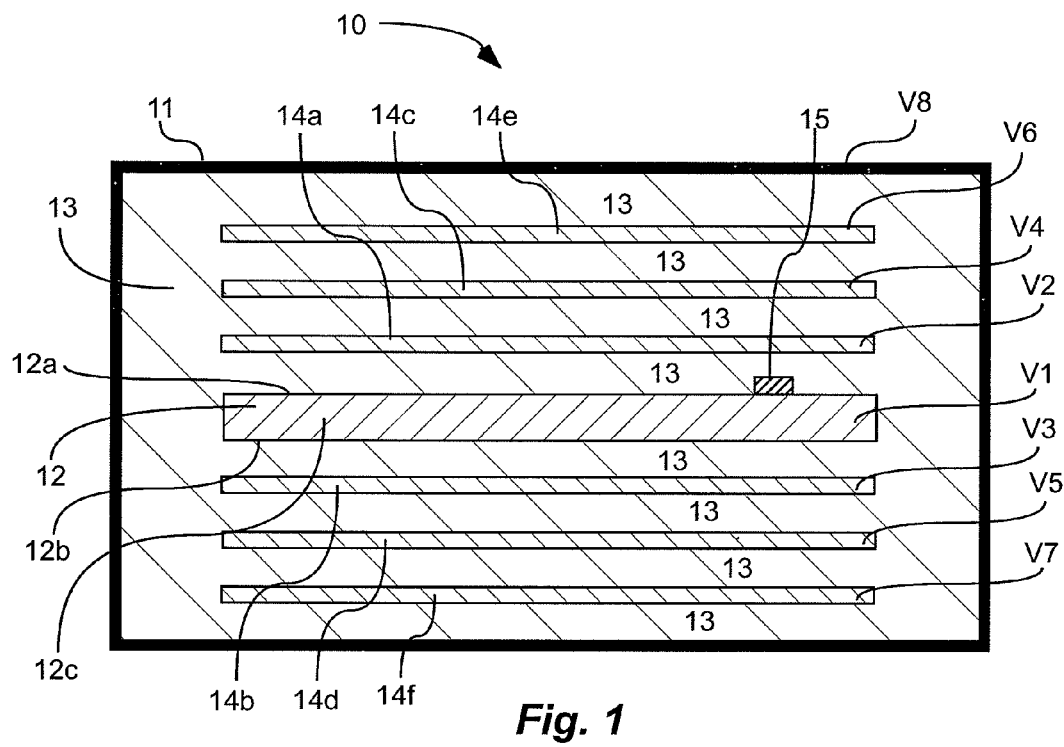
FIG. 1 is a schematic cross-sectional side view of a high voltage device 10, including a circuit board 12 surrounded by an enclosure 11, potting 13 providing electrical insulation between the circuit board 12 and the enclosure 11, and a layer of material 14, having a different resistivity than a resistivity of the potting 13, dividing the potting 13 into separate and discrete sections, in order to improve the dielectric strength of the potting 13, and thus provide improved electrical insulation between the enclosure 11 and the circuit board 12; in accordance with an embodiment of the present invention.

As illustrated in FIG. 1, a high voltage device 10 is shown, comprising a circuit board 12 surrounded by an enclosure 11. Potting 13 provides electrical insulation between the circuit board 12 and the enclosure 11. A layer of material 14, having a different resistivity than a resistivity of the potting 13, is disposed within the potting material 13 and disposed at least partially between the circuit board and the enclosure. The layer of material 14 divides the potting 13 into separate and discrete sections in order to improve dielectric strength of the potting 13, and thus provide improved electrical insulation between the enclosure 11 and the circuit board 12.

The circuit board 12 can include at least one high voltage component 15 configured to have a higher voltage differential between this component 15 (or these components 15 if there are multiple components with the same high voltage) and the enclosure 11 than other components on the circuit board 12. A circuit on the circuit board 12 can be configured to create a voltage differential between at least one component on the circuit board 12, such as the high voltage component 15 for example, and the enclosure 11 of at least 1 kilovolt in one embodiment, at least 9 kilovolts in another embodiment, or at least 29 kilovolts in another embodiment. The layer of material 14 disposed in the potting 13, described previously, can be electrically conductive. The separate and discrete sections of the potting 13 can have a higher dielectric strength than if the sections of potting 13 were not divided by the layer of material 14. The separate and discrete sections of potting 13 can provide electrical insulation between the high voltage component 15 and the enclosure 11. The layer of material 14 can be configured to have a voltage applied that is between a voltage of the high voltage component 15 and a voltage of the enclosure 11. In one embodiment, the high voltage device 10 (or 20 in FIG. 2) is a power source for an x-ray tube (31 in FIG. 3).

Separating the potting 13 into separate and discrete sections can result in improved dielectric strength per unit distance of each potting layer, improved overall dielectric strength of the potting, and resulting reduced potting arcing failures. Electrical resistance through the potting material 13 is not necessarily consistent, which may result in inconsistent voltage drop per unit distance through the potting 13. A more uniform voltage differential may be obtained by applying voltages to conductive layers 14, which can improve the electrical insulation of the potting 13 and reduce arcing failures.

In one embodiment, the high voltage component 15 can be a region of multiple high voltage components, all having substantially the same voltage. For example, several components on the circuit board 12 can have a voltage of about positive or negative 40 kilovolts.

In one embodiment, the potting material 13 can comprise silicon. The layer of material 14 can be electrically conductive and can comprise copper. In one embodiment, the layer of material 14 can be electrically conductive and can comprise multiple layers 14a-f. Voltages V2-7 can be applied to the electrically conductive layers and can progressively decrease from a highest absolute value of voltage nearest the circuit board 12 to a lowest absolute value of voltage nearest the enclosure 11. The enclosure can be maintained at ground voltage (V8=0). For example, |V1|>|V2|>|V4|>|V6|>0 and/or |V1|>|V3|>|V5|>|V7|>0.

In one embodiment, the circuit board can comprise a first face 12a and a second face 12b, each having a larger surface area than any other face 12c of the circuit board. For example, a circuit board typically has two large faces, parallel with each other, where components are mounted. The layer of material 14 can be electrically conductive and can comprise a first layer 14a and a second layer 14b. The first layer 14a (1) can be disposed between the first face 12a and the enclosure 11; (2) can have a surface area on a side facing the first face 12a that is at least 0.8 times and less than 1.2 times an area of the first face 12a of the circuit board and (3) can be configured to have a voltage V2 applied that is between a voltage of the high voltage component 15 and a voltage of the enclosure 11. The second layer 14b (1) can be disposed between the second face 12b of the circuit board 12 and the enclosure 11; (2) can have a surface area on a side facing the second face 12b that is at least 0.8 times and less than 1.2 times an area of the second face 12b of the circuit board 12; and (3) can be configured to have a voltage V3 applied that is between a voltage of the high voltage component 15 and a voltage of the enclosure 11.

In one embodiment, the first layer 14a and the second layer 14b can be configured to have substantially the same voltage applied to each (V2=V3). Potting material 13 can be disposed between the first layer 14a and the circuit board 11, between the first layer 14a and the enclosure 11, between the second layer 14b and the circuit board 11, and between the second layer 14b and the enclosure 11.

In another embodiment, the electrically conductive layer 14, described in the previous paragraph, can further comprise a third layer 14c and a fourth layer 14d. The third layer 14c (1) can be disposed between the first layer 14a and the enclosure 11; and (2) can be configured to have a voltage V4 applied that is between a voltage V2 of the first layer 14a and a voltage V8 of the enclosure 11. The fourth layer 14d (1) can be disposed between the second layer 14b and the enclosure 11; and (2) can be configured to have a voltage V5 applied that is between a voltage V3 of the second layer and a voltage V8 of the enclosure 11.

In one embodiment, the first layer 14a and the second layer 14b can be configured to have substantially the same voltage applied to each (V2=V3) and the third layer 14c and the fourth layer 14d can be configured to have substantially the same voltage applied to each (V4=V5). Potting material 13 can be disposed between the first layer 14a and the circuit board 11, between the first layer 14a and the third layer 14c, between the third layer 14c and the enclosure 11, between the second layer 14b and the circuit board 11, between the second layer 14b and the fourth layer 14d, and between the fourth layer 14d and the enclosure 11. In one embodiment, the first layer 14a, the second layer 14b, the third layer 14c, and the fourth layer 14d have substantially the same surface area on a side facing the circuit board 12.

In another embodiment, the electrically conductive layer 14, described in the previous paragraph, can further comprise a fifth layer 14e and a sixth layer 14f. The fifth layer 14e (1) can be disposed between the third layer 14c and the enclosure 11; and (2) can be configured to have a voltage V6 applied that is between a voltage V4 of the third layer 14c and a voltage V8 of the enclosure 11. The sixth layer 14f (1) can be disposed between the fourth layer 14d and the enclosure 11; and (2) can be configured to have a voltage V7 applied that is between a voltage V5 of the fourth layer and a voltage V8 of the enclosure 11. Potting material 13 can be disposed, in addition to locations described above, between the third layer 14c and the fifth layer 14e, between the fifth layer 14c and the enclosure 11, between the fourth layer 14d and the sixth layer 14f, between the sixth layer 14f and the enclosure 11. In one embodiment, the first layer 14a, the second layer 14b, the third layer 14c, the fourth layer 14d, the fifth layer 14e, and the sixth layer 14f have substantially the same surface area on a side facing the circuit board.

In another embodiment, the electrically conductive layer 14, described in the previous paragraph, can further comprise more than the six layers described before, and can be similarly configured as that described previously. In one embodiment, the layers described in the previous paragraphs can be a non electrically conductive material that has a resistivity different from that of the potting, and need not have voltages applied to each layer. In another embodiment, the layers described in the previous paragraphs can be electrically conductive material, and need not have voltages applied to each layer.

The layers 14 can be made of circuit board material and can have a sheet of metal applied to make a conductive layer. The layers 14 can be attached to each other by bolts or insulative connectors. Voltages V2-7 can be applied to layers 14 by electrical connectors and/or resistors from the circuit board 11 to the layers 11. The resistors can have very large voltages, such as greater than 1 megaohm or greater than 10 megaohms.

Figure 2:
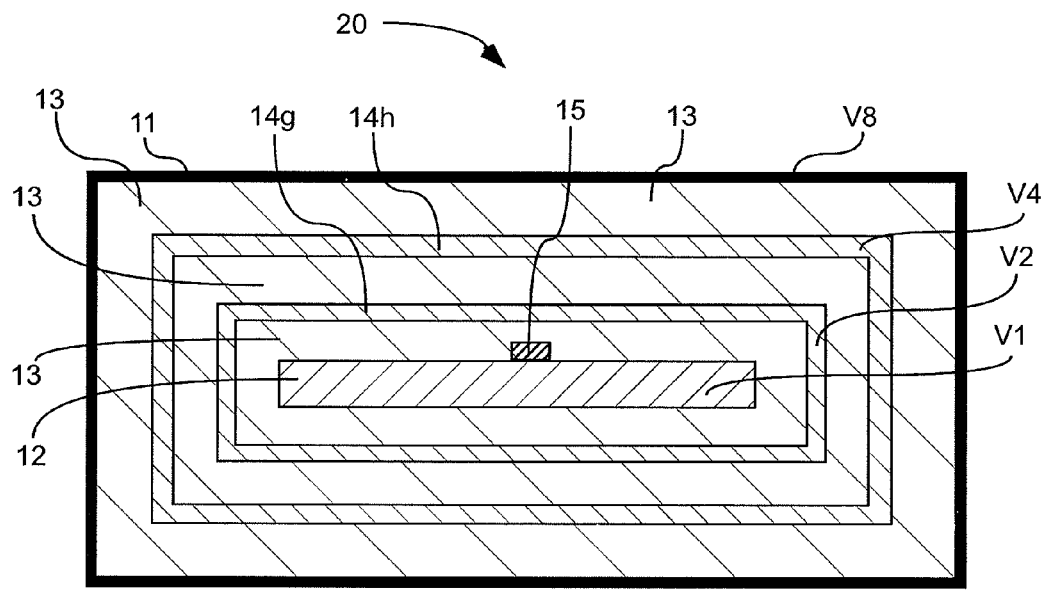
FIG. 2 is a schematic cross-sectional side view of a high voltage device 20, including a circuit board 12 surrounded by an enclosure 11, potting 13 providing electrical insulation between the circuit board 12 and the enclosure 11, and a layer of material 14, having a different resistivity than a resistivity of the potting 13, substantially surrounding the circuit board 12 and dividing the potting 13 into separate and discrete sections, in order to improve the dielectric strength of the potting, and thus provide improved electrical insulation between the enclosure and the circuit board; in accordance with an embodiment of the present invention.

As shown in FIG. 2, high voltage device 20 can have a similar structure as described in many of the previous embodiments. A difference in high voltage device 20 shown in FIG. 2 compared to high voltage device 10 in FIG. 1 is that the layer of material 14 in high voltage device 20 can substantially surround the circuit board 12. The layer of material 14 can be conductive. The layer of material 14 can comprise at least two layers 14g-h, each layer substantially surrounds the circuit board, and an outer layer 14h substantially surrounds an inner layer 14g. Potting material 13 can be disposed between an innermost layer and the circuit board, between any two adjacent layers, and between an outermost layer and the enclosure. Any layer 14 closer to the circuit board can be configured to have a higher absolute value of voltage applied than any other layer 14 farther from the circuit board. For example, |V1|>|V2|>|V4|>0.

High voltage device 20 can be made by applying potting 13 as a liquid, less viscous material, or spray around the circuit board 11, curing to solidify the potting, then applying the layer of material 14 as a liquid, less viscous material, or spray and curing the layer of material 14. This process of applying potting 13 and layer of material 14 can be repeated until the desired number of layers is applied. Wires can be used to apply voltages from the circuit board 11 to conductive layers of material 14 if desired. Applying voltages to the layers can create a more consistent voltage drop per unit distance, or voltage differential, through the potting 13. A more uniform voltage differential can improve the electrical insulation of the potting 13 and reduce arcing failures.

In the embodiments described herein, a circuit on the circuit board can be configured to create a voltage differential between the high voltage component 15 and the enclosure 11 of at least 19, kilovolts, at least 29 kilovolts, at least 39 kilovolts; at least 49, kilovolts, at least 59 kilovolts, or at least 69 kilovolts.

Figure 3:
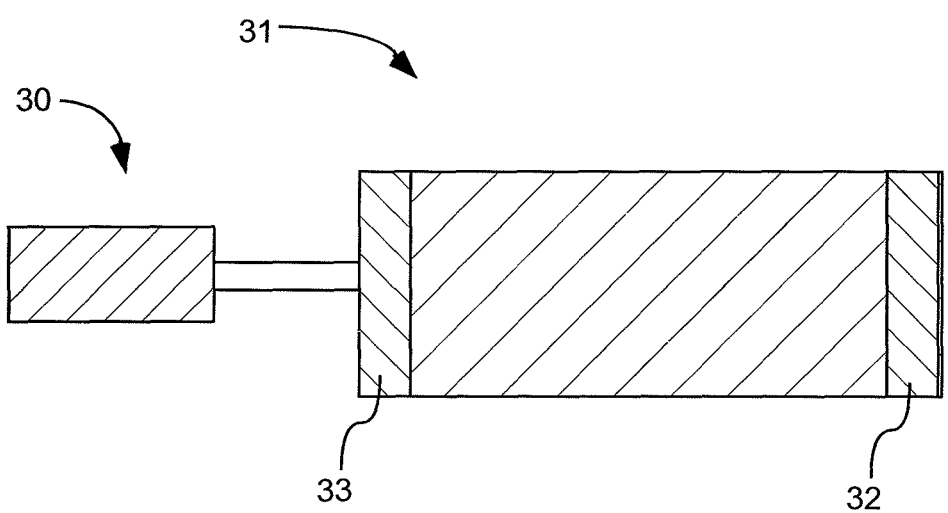
FIG. 3 is a schematic cross-sectional side view of a high voltage device 30 providing high voltage to an x-ray tube 31; in accordance with an embodiment of the present invention.

In one embodiment, shown in FIG. 3, any of the previously described power sources 30 can be used to supply power to an x-ray tube 31. A circuit on the circuit board 12 can be configured to create a voltage differential between the high voltage component 15 and the enclosure 11 of at least 9 kilovolts and a voltage differential between an anode 32 and a cathode 33 of the x-ray tube 31 of at least 9 kilovolts.

What is claimed is:

1. A power source device for an x-ray tube, comprising:
   a. a circuit board substantially surrounded by an enclosure;
   b. a high voltage component on the circuit board configured to have a higher voltage differential between this component and the enclosure than other components on the circuit board;
   c. a circuit on the circuit board configured to create a voltage differential between the high voltage component and the enclosure of at least 9 kilovolts;
   d. an electrically insulative potting material disposed between the circuit board and the enclosure;
   e. a layer of electrically conductive material disposed within the potting material and disposed at least partially between the circuit board and the enclosure;
   f. the layer of electrically conductive material dividing at least a portion of the potting into separate and discrete sections, the separate and discrete sections of potting having a higher dielectric strength than if the sections of potting were not divided by the layer of electrically conductive material;
   g. the separate and discrete sections of potting providing electrical insulation between the high voltage component and the enclosure; and
   h. the layer of electrically conductive material is configured to have a voltage applied that is between a voltage of the high voltage component and a voltage of the enclosure.

2. The device of claim 1, wherein the high voltage component is a region of multiple high voltage components, all having substantially the same voltage.

3. The device of claim 1, wherein the potting material comprises silicon and the layer of electrically conductive material comprises copper.

4. The device of claim 1, wherein the layer of electrically conductive material comprises multiple layers and wherein voltages applied to the electrically conductive layers progressively decrease from a highest absolute value of voltage nearest the circuit board to a lowest absolute value of voltage nearest the enclosure.

5. The device of claim 1, wherein:
   a. the circuit board comprises a first face and a second face, each having a larger surface area than any other face of the circuit board;
   b. the layer of electrically conductive material comprises a first layer and a second layer;
   c. the first layer:
      i. is disposed between the first face and the enclosure;
      ii. has a surface area on a side facing the first face that is at least 0.8 times and less than 1.2 times an area of the first face;

iii. is configured to have a voltage applied that is between a voltage of the high voltage component and a voltage of the enclosure; and
d. the second layer:
i. is disposed between the second face and the enclosure;
ii. has a surface area on a side facing the first face that is at least 0.8 times and less than 1.2 times an area of the second face;
iii. is configured to have a voltage applied that is between a voltage of the high voltage component and a voltage of the enclosure.

6. The device of claim 5, wherein the first layer and the second layer are configured to have substantially the same voltage applied to each.

7. The device of claim 5, wherein:
a. the layer of electrically conductive material further comprises a third layer and a fourth layer;
b. the third layer:
i. is disposed between the first layer and the enclosure;
ii. is configured to have a voltage applied that is between a voltage of the first layer and a voltage of the enclosure;
c. the fourth layer:
i. is disposed between the second layer and the enclosure;
ii. is configured to have a voltage applied that is between a voltage of the second layer and a voltage of the enclosure; and
d. potting material is disposed between the first layer and the circuit board, between the first layer and the third layer, between the third layer and the enclosure, between the second layer and the circuit board, between the second layer and the fourth layer, and between the fourth layer and the enclosure.

8. The device of claim 7, wherein the first layer, the second layer, the third layer, and the fourth layer have substantially the same surface area on a side facing the circuit board.

9. The device of claim 1, wherein:
a. the layer of electrically conductive material comprises at least two layers;
b. each layer substantially surrounds the circuit board;
c. an outer layer substantially surrounds an inner layer;
d. potting material is disposed between an innermost layer of electrically conductive material and the circuit board, between any two adjacent layers of electrically conductive material, and between an outermost layer of electrically conductive material and the enclosure; and
e. any layer closer to the circuit board will be configured to have a higher absolute value of voltage applied than any other layer farther from the circuit board.

10. The device of claim 1, wherein the enclosure is at ground voltage.

11. The device of claim 1, wherein a circuit on the circuit board is configured to create a voltage differential between the high voltage component and the enclosure of at least 39 kilovolts.

12. A power source device for an x-ray tube, comprising:
a. a circuit board substantially surrounded by an enclosure;
b. a circuit on the circuit board configured to create a voltage differential between at least one component on the circuit board and the enclosure of at least 9 kilovolts;
c. an electrically insulative potting material disposed between the circuit board and the enclosure;
d. a layer of material disposed within the potting material and disposed at least partially between the circuit board and the enclosure, the layer of material having a different resistivity than a resistivity of the potting;
e. the layer of material dividing at least a portion of the potting into separate and discrete sections;
f. the separate and discrete sections of potting providing electrical insulation between the circuit board and the enclosure.

13. A device with electric potential control of high voltage insulation, comprising:
a. a circuit board substantially surrounded by an enclosure;
b. a high voltage component on the circuit board configured to have a higher voltage differential between this component and the enclosure than other components on the circuit board;
c. a circuit on the circuit board configured to create a voltage differential between the high voltage component and the enclosure of at least 1 kilovolt;
d. an electrically insulative potting material disposed between the circuit board and the enclosure;
e. a layer of electrically conductive material disposed within the potting material and disposed at least partially between the circuit board and the enclosure;
f. the layer of electrically conductive material dividing at least a portion of the potting into separate and discrete sections, the separate and discrete sections of potting having a higher dielectric strength than if the sections of potting were not divided by the layer of electrically conductive material;
g. the separate and discrete sections of potting providing electrical insulation between the high voltage component and the enclosure; and
h. the layer of electrically conductive material is configured to have a voltage applied that is between a voltage of the high voltage component and a voltage of the enclosure.

14. The device of claim 13, wherein the high voltage component is a region of multiple high voltage components, all having substantially the same voltage.

15. The device of claim 13, wherein the layer of electrically conductive material comprises multiple layers and wherein voltages applied to the electrically conductive layers progressively decrease from a highest voltage nearest the circuit board to a lowest voltage nearest the enclosure.

16. The device of claim 13 wherein:
a. the circuit board comprises a first face and a second face, each having a larger surface area than any other face of the circuit board;
b. the layer of electrically conductive material comprises a first layer, a second layer, a third layer, and a fourth layer;
c. the first layer:
i. is disposed between the first face and the enclosure;
ii. has a surface area on a side facing the first face that is at least 0.8 times and less than 1.2 times an area of the first face;
iii. is configured to have a voltage applied that is between a voltage of the high voltage component and a voltage of the enclosure; and
d. the second layer:
i. is disposed between the second face and the enclosure;
ii. has a surface area on a side facing the first face that is at least 0.8 times and less than 1.2 times an area of the second face;
iii. is configured to have a voltage applied that is between a voltage of the high voltage component and a voltage of the enclosure;
e. the third layer:
i. is disposed between the first layer and the enclosure;

ii. is configured to have a voltage applied that is between a voltage of the first layer and a voltage of the enclosure;
f. the fourth layer:
   i. is disposed between the second layer and the enclosure;
   ii. is configured to have a voltage applied that is between a voltage of the second layer and a voltage of the enclosure;
g. potting material is disposed between the first layer and the circuit board, between the first layer and the third layer, between the third layer and the enclosure, between the second layer and the circuit board, between the second layer and the fourth layer, and between the fourth layer and the enclosure;
h. the first layer, the second layer, the third layer, and the fourth layer have substantially the same surface area on a side facing the circuit board.

17. The device of claim 16 wherein:
a. the first layer and the second layer are configured to have substantially the same voltage applied; and
b. the third layer and the fourth layer are configured to have substantially the same voltage applied.

18. The device of claim 13, wherein:
a. the layer of electrically conductive material comprises at least two layers;
b. each layer substantially surrounds the circuit board;
c. potting material is disposed between an innermost layer of electrically conductive material and the circuit board, between any two adjacent layers of electrically conductive material, and between an outermost layer of electrically conductive material and the enclosure;
d. any layer closer to the circuit board will be configured to have a higher absolute value of voltage applied than any other layer farther from the circuit board.

19. The device of claim 13, further comprising an x-ray tube and wherein a circuit on the circuit board is configured to create a voltage differential between the high voltage component and the enclosure of at least 9 kilovolts and a voltage differential between an anode and a cathode of an x-ray tube of at least 9 kilovolts.

20. The device of claim 13, wherein the high voltage component is a region of multiple high voltage components, all having substantially the same voltage.

\* \* \* \* \*